(12) United States Patent
Alok

(10) Patent No.: US 6,323,506 B1
(45) Date of Patent: Nov. 27, 2001

(54) SELF-ALIGNED SILICON CARBIDE LMOSFET

(75) Inventor: Dev Alok, Danbury, CT (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/469,454

(22) Filed: Dec. 21, 1999

(51) Int. Cl.[7] .............................................. H01L 31/0312
(52) U.S. Cl. ............................................. 257/77; 257/288
(58) Field of Search .............................. 257/77, 288, 330, 257/332, 333, 336, 339, 343, 344, 461

(56) References Cited

U.S. PATENT DOCUMENTS

| | | | |
|---|---|---|---|
| 4,453,305 | 6/1984 | Janes et al. | 29/571 |
| 4,757,028 | * 7/1988 | Kondoh et al. | 357/61 |
| 5,371,024 | 12/1994 | Hieda et al. | 437/40 |
| 5,378,912 | 1/1995 | Pein | 257/77 |
| 5,672,889 | * 9/1997 | Brown | 257/77 |
| 5,726,463 | * 3/1998 | Brown et al. | 257/77 |
| 5,963,791 | * 10/1999 | Brown et al. | 438/105 |
| 6,096,607 | * 8/2000 | Ueno | 438/268 |

FOREIGN PATENT DOCUMENTS

| | | |
|---|---|---|
| 08088283 | 4/1996 | (JP) . |
| 9922407A1 | 5/1999 | (WO) . |

OTHER PUBLICATIONS

PHA 23,900, "Silicon Carbide N–Channel Power LMOS-FET", filed concurrently herewith.

PHA 23,910, "Silicon Carbide LMOSFET with Gate Reach-through Protection", filed concurrently herewith.

* cited by examiner

*Primary Examiner*—David Nelms
*Assistant Examiner*—David Nhu
(74) *Attorney, Agent, or Firm*—Steven R. Biren

(57) ABSTRACT

A lateral metal-oxide-semiconductor field effect transistor (LMOSFET) having a self-aligned gate, includes a first layer of SiC semiconductor material having a p-type conductivity, and a second layer of SiC semiconductor material having an n-type conductivity formed on the first layer. Source and drain regions having n-type conductivities are formed in the second SiC semiconductor layer. The n-type conductivities of the source and drain regions are greater than the n-type conductivity of the second SiC layer. A trench extends through the second SiC semiconductor layer and partially into the first SiC semiconductor layer. The trench is coated with a layer of an electrically insulating oxide material and partially filled with a layer of metallic material. The layers of oxide and metallic material form a gate structure. A channel region is defined in the first layer beneath the gate structure, and electrical contacts associated with the source and drain regions, and the gate structure, establish source, drain, and gate electrodes of the LMOSFET.

8 Claims, 4 Drawing Sheets

SELF-ALIGNED SILICON CARBIDE LMOSFET

RELATED APPLICATIONS

Commonly-assigned, copending U.S. patent application, Ser. No. 09/469,451, entitled "Silicon Carbide LMOSFET With Gate Reach-Through Protection", filed Feb. 21, 1999.

Commonly-assigned, copending U.S. patent application, No. 09/469,450, entitled "Silicon Carbide N-Channel Power LMOSFET", filed Feb. 21, 1999.

FIELD OF THE INVENTION

This invention relates to lateral metal-oxide-semiconductor field effect transistors (LMOSFETs) used in high-power applications such as UHF transmission which are especially suited for silicon carbide (SiC) technology. In particular, the invention relates to a SiC LMOSFET having a self-aligned gate structure and a method of fabricating same.

BACKGROUND OF THE INVENTION

In recent years, the use of silicon lateral double-diffused metal-oxide-semiconductor field effect transistors (Si LDMOSFETs) in high-power and high-frequency applications has increased enormously. This is because Si LDMOSFETs offer simpler gate drive and faster response than bipolar devices.

Si LDMOSFETs are typically fabricated using self-aligned techniques, which minimize gate overlap of the source and drift/drain regions. Minimal overlap is critical for maintaining low gate-to-source and gate-to-drift/drain capacitances, which can adversely affect the high frequency performance of the device. It is also desirable to reduce the overlap to decrease the cell pitch and conserve the silicon area used by the device.

FIG. 1 is a cross-sectional view of a typical Si LDMOSFET 10 fabricated using self-aligned gate techniques. Such techniques involve defining a gate metal 12 (polysilicon) on top of the gate oxide 11 prior to forming the other structures of the device. Once the gate metal 12 has been defined, N+ source and drain regions 13, 14, a P base region 15, and an N− drift region 16 are fabricated by diffusing the N+ source region 13 and the P base region 15 from the source side of the wafer 17, and diffusing the N− drift region 16 and the N+ drain region 14 from the drain side of the wafer 17, thus self-aligning the source, base, drain and drift regions 13, 15, 14, 16 with the gate metal 12. Because the diffusion temperatures used in silicon-based technology are only about 900–1000° C., the gate metal 12 and gate oxide 11 are not adversely affected.

Silicon carbide (SiC) is an attractive semiconductor material for high frequency and high power applications. The properties which make SiC attractive for high power UHF applications are its large critical electric field (10 times that of Si) and its large electron saturation velocity (2 times that of Si). The large critical electric field helps increase the breakdown voltage of the device and the large saturation velocity helps increase the peak current.

Theoretically, it should be possible to achieve power densities which are 20 times higher than that of Si LDMOSFETs with comparable feature sizes in SiC LDMOSFETs. The operating frequency and gain should be similar for both Si and SiC devices with comparable gate lengths. Hence, it would be desirable to fabricate the LDMOSFET 10 shown in FIG. 1 in SiC instead of Si.

Unfortunately, there are many practical difficulties in achieving the LDMOSFET 10 of FIG. 1 in SiC. One difficulty is that it is not possible to diffuse the dopants in SiC, thus only high energy ion implantation can be used to fabricate source, base, drift and drain regions. However, implanted dopants in SiC require implantation activation temperatures in excess of 1500° C. Both the gate oxide and gate metal are incapable of withstanding such high temperatures. Consequently, the source, drain, base and drift regions must be activated before fabricating the gate oxide and gate metal. This in turn, undesirably results in a device structure which is no longer self-aligned as the gate metal is fabricated after source and drain fabrication.

Another difficulty in achieving the device structure 10 of FIG. 1 in SiC concerns the formation of the channel. The channel 19 of the Si LDMOSFET 10 of FIG. 1 is formed in a diffused P base region 15. This may not be practical to do in SiC because the inversion layer will be formed in an implanted P base region. Very low inversion layer mobilities (less than 1 $cm^2/Vs$) have been achieved in implanted P base regions in SiC. Inversion layer mobilities higher than 100 $cm^2/Vs$ have only been achieved on epitaxial p-type SiC layers.

FIG. 2 shows a SiC lateral MOSFET (LMOSFET) 20 which attempts to solve the above problems. In this LMOSFET, N+ source, N− drift and N+ drain regions 22, 24, 23 are fabricated first in a lightly doped P− epitaxial layer 21, followed by a gate oxide 25, and a gate metal 26. A channel region 27 is defined beneath the gate metal and gate oxide 26, 25 in the P− epitaxial layer 21 (instead of in a P− base region as in the MOSFET of 10 of FIG. 1). During fabrication of the gate structure, the gate metal 26 is aligned to the N+ source region 22 and the N− drift region 24. However, the gate-to-source and gate-to-drift region overlap "x" must be made sufficiently larger than the alignment tolerance. Hence, the overlaps can be anywhere between 0.5 to 2 microns, depending upon the type of alignment tool used.

Although the SiC LMOSFET 20 of FIG. 2 is operational, it has a number of limitations. In particular, the gate-to-source and gate-to-drift region overlap x of the LMOSFET 20 is much larger than the gate-to-source and gate-to-drift/drain region overlaps in self-aligned Si LDMOSFET structures which typically are about 0.75 times the junction depth and can be made very small.

Further, because the N− drift region 24 is implanted in the P− epitaxial layer 21, the doping concentration in the drift-region 24 has to be significantly (greater than 5 times) higher than the concentration in the P− epitaxial layer 21. This puts additional constraints on choice of drift region depth and concentration.

Still further, the SiC LMOSFET of FIG. 2 suffers from "gate reach-through" as the gate region is formed on top of the lightly doped P− epitaxial layer 21 instead of a highly doped P base region. Moreover, the concentration of N− drift region 24 is higher than the P− epitaxial layer 21 which forces the depletion region to extend farther into the P− epitaxial layer 21 thereby further complicating the problem of gate reach-through.

Additionally, as mentioned earlier, implanted regions in SiC have been shown to have relatively poor mobility in comparison to similarly doped epitaxial layers. Hence, the N− drift region 24 formed in the SiC LMOSFET 20 of FIG. 2 will undesirably provide higher "on-resistance".

Therefore, a self-aligned SiC LMOSFET is needed which overcomes the above problems.

SUMMARY OF THE INVENTION

A lateral metal-oxide-semiconductor field effect transistor (LMOSFET) having a self-aligned gate, comprises a first layer of silicon carbide semiconductor material having a p-type conductivity, and a second layer of silicon carbide semiconductor material having an n-type conductivity formed on the first layer. Source and drain regions having n-type conductivities are formed through the second silicon carbide semiconductor layer and can extend partially into the first silicon carbide semiconductor layer. The n-type conductivities of the source and drain regions are greater than the n-type conductivity of the second silicon carbide layer. A trench extends through the second silicon carbide semiconductor layer and partially into the first silicon carbide semiconductor layer so that the source and drain regions are substantially lateral thereto. The trench is coated with a layer of an electrically insulating oxide material and partially filled with a layer of metallic material. The layers of oxide and metallic material form a gate structure. A channel region is defined in the first layer beneath the gate structure, and electrical contacts associated with the source and drain regions, and the gate structure, establish source, drain, and gate electrodes of the LMOSFET.

Another aspect of the invention involves a method for making a LMOSFET with a self-aligned gate. The method comprises providing a wafer including a first layer of silicon carbide semiconductor material having a p-type conductivity, and a second layer of silicon carbide semiconductor material having an n-type conductivity disposed on the first layer. Source and drain regions having n-type conductivities are formed in the second silicon carbide semiconductor layer. A trench is created through the second silicon carbide semiconductor layer and partially into the first silicon carbide semiconductor layer so that the source and drain regions are substantially lateral thereto. A layer of electrically insulating oxide material is grown or deposited on the surface of the trench. The trench is then partially filled with a layer of metallic material to define a gate structure. The gate structure establishes a channel region therebeneath in the first layer. Electrical contacts which cooperate with the source and drain regions, and the gate structure, are formed to establish source, drain, and gate electrodes of the LMOSFET.

BRIEF DESCRIPTION OF THE DRAWINGS

The advantages, nature, and various additional features of the invention will appear more fully upon consideration of the illustrative embodiment now to be described in detail in connection with accompanying drawings wherein.

It should be understood that the drawings are for purposes of illustrating the concepts of the invention and are not to scale.

DETAILED DESCRIPTION OF THE INVENTION

Figure 1:
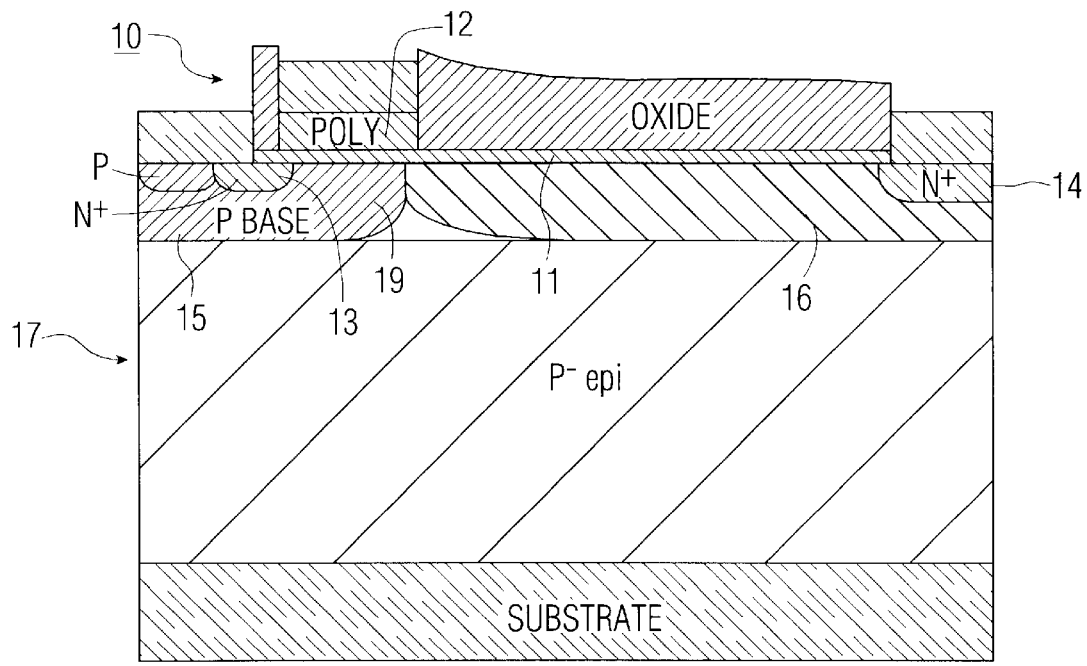
FIG. 1 is a cross-sectional view of a prior art Si LDMOSFET.
Figure 2:
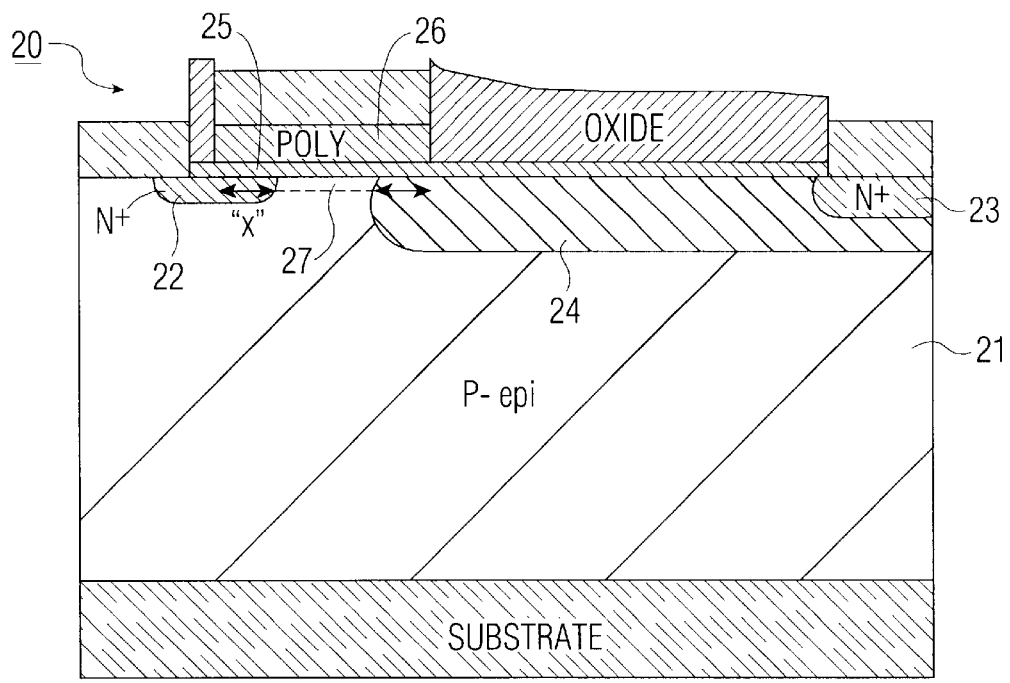
FIG. 2 is a cross-sectional view of a SiC LMOSFET.
Figure 3:
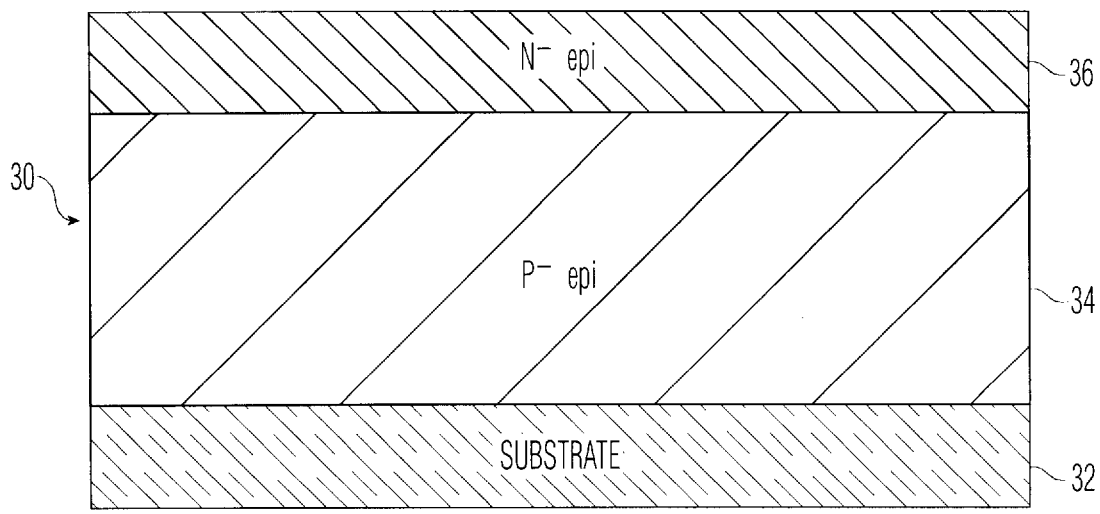
FIG. 3 is a cross-sectional view of a starting wafer used for fabricating a SiC LMOSFET with a self-aligned gate according to an embodiment of the invention.

FIG. 3 shows a layered wafer 30 used for fabricating a self-aligned SiC lateral metal-oxide-semiconductor field effect transistor (LMOSFET) according to an embodiment of the invention. The wafer 30 comprises a substrate 32 with a P– epitaxial layer 34 (P– epilayer) grown on top of the substrate 32, and a lightly-doped n-type epitaxial SiC layer 36 (N– epilayer) grown on top of the P– epilayer 34. The substrate 32 can be made from any suitable n or p doped Si or SiC semiconductor material, or an insulating material such as undoped Si, undoped SiC, or glass. The P– and N– epilayers 34, 36 are epitaxially grown using conventional methods such as chemical vapor deposition CVD, and are doped using conventional aluminum, boron or nitrogen incorporation during epitaxial growth. The thickness and doping of the P– epilayer 34 are selected according to the desired electrical breakdown voltage of the LMOSFET. The thickness (selected to be as small as possible) and doping of the N– epilayer 36 are selected using the reduced surface field (RESURF) effect according to the desired breakdown voltage of the LMOSFET. The doping concentration of the N– epilayer 36 is also selected independent of that of the P– epilayer 34.

Figure 4:
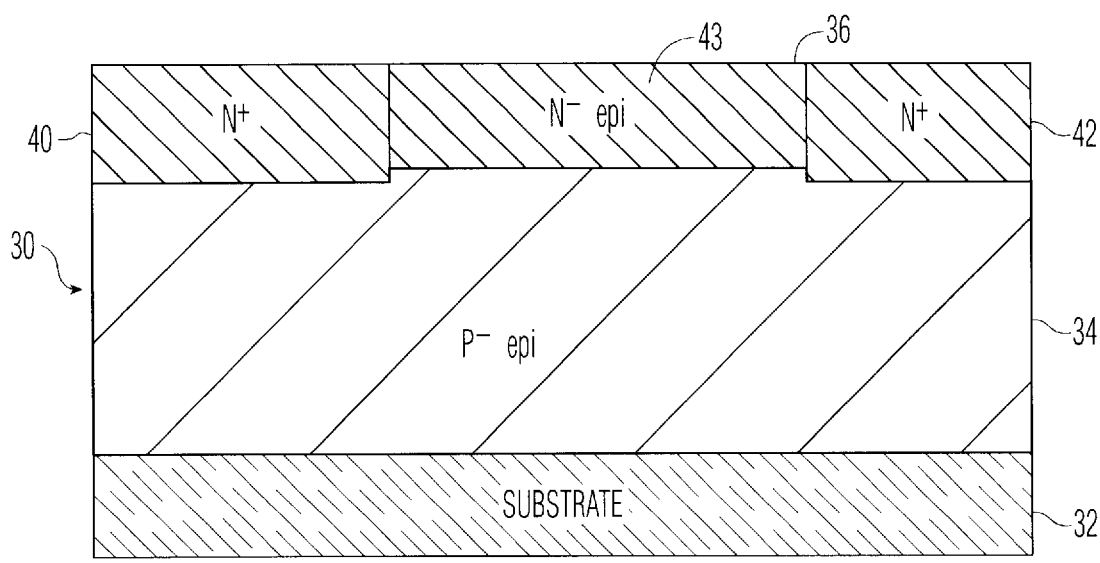
FIGS. 4–6 are cross-sectional views of the wafer of FIG. 3 depicting various steps used in fabrication of the SiC LMOSFET of the invention.

As shown in FIG. 4, source and drain regions 40, 42 are fabricated first in the layered wafer 30 by selectively implanting an N+ dopant in the top surface thereof The implant depth is selected to be substantially equal to or slightly greater (as shown) than the thickness of the N– epilayer 36. The N+ dopant is then activated using any desired processing temperature. Note that the N– epilayer 36 will advantageously form a lightly n-doped extension of the drain region 42 referred to herein as a drift region 43.

Figure 5:
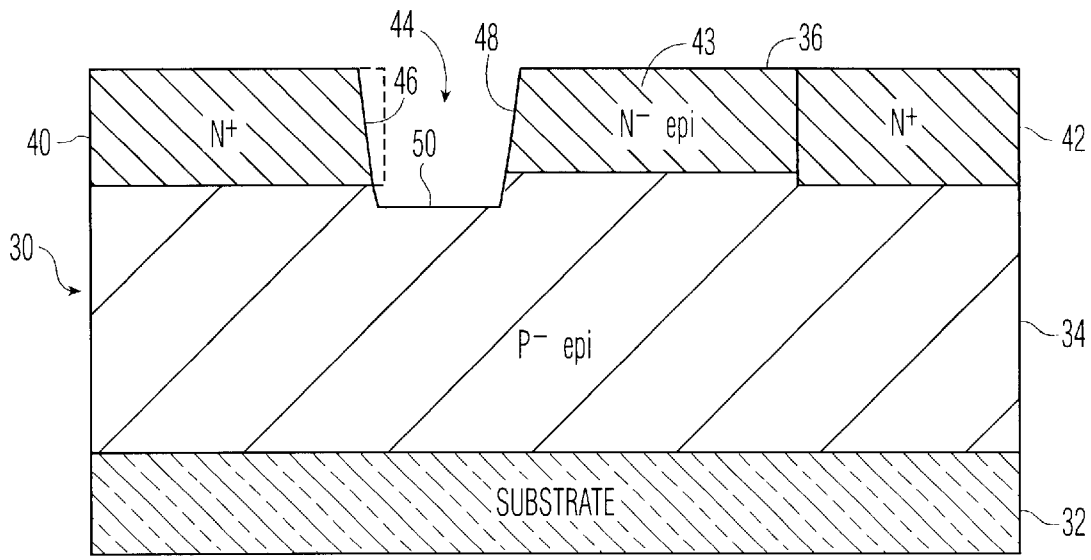

In FIG. 5, a trench 44 is etched through the N– epilayer 36 and partially into the P– epilayer 34 using any preferred technique such as reactive ion etching (RIE) or electrochemical etching. The trench 44 includes first and second opposing sides 46, 48 and a bottom 50 extending between the sides 46, 48. The first side 46 of the trench 44 should overlap into the source region 40 and the bottom 50 of the trench 44 should have a depth which is slightly greater (about 50 nanometers depending on the technique used for etching the trench) than the depth of the source region 40.

Figure 6:
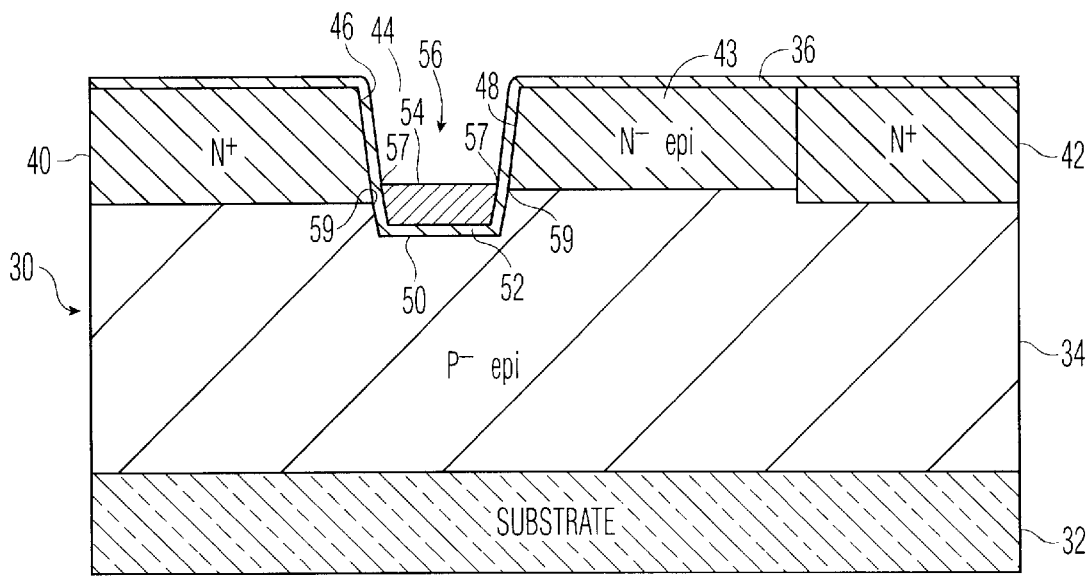

In FIG. 6, a layer 52 of oxide material such as silicon dioxide is formed on the sides 46, 48 and bottom 50 of the trench 44. The trench 44 is then partially filled with a layer 54 of metallic material such as polysilicon. The oxide layer 52 can be formed using any preferred conventional method such as deposition, thermal oxidation or combination thereof The layer 54 metallic material is deposited in the trench 44 using any preferred conventional method such as sputtering or chemical vapor deposition (CVD). The layer 54 of metallic material in cooperation with the underlying layer 52 of oxide material forms a self-aligned gate structure 56 having edges 57 which are substantially aligned with the edges 59 of the source and drift regions 40, 43. Accordingly, the gate-to-source and gate-to-drift region (edge) overlap can be advantageously controlled by the thickness of the gate metal 54, which can be selected to be very small.

Figure 7:
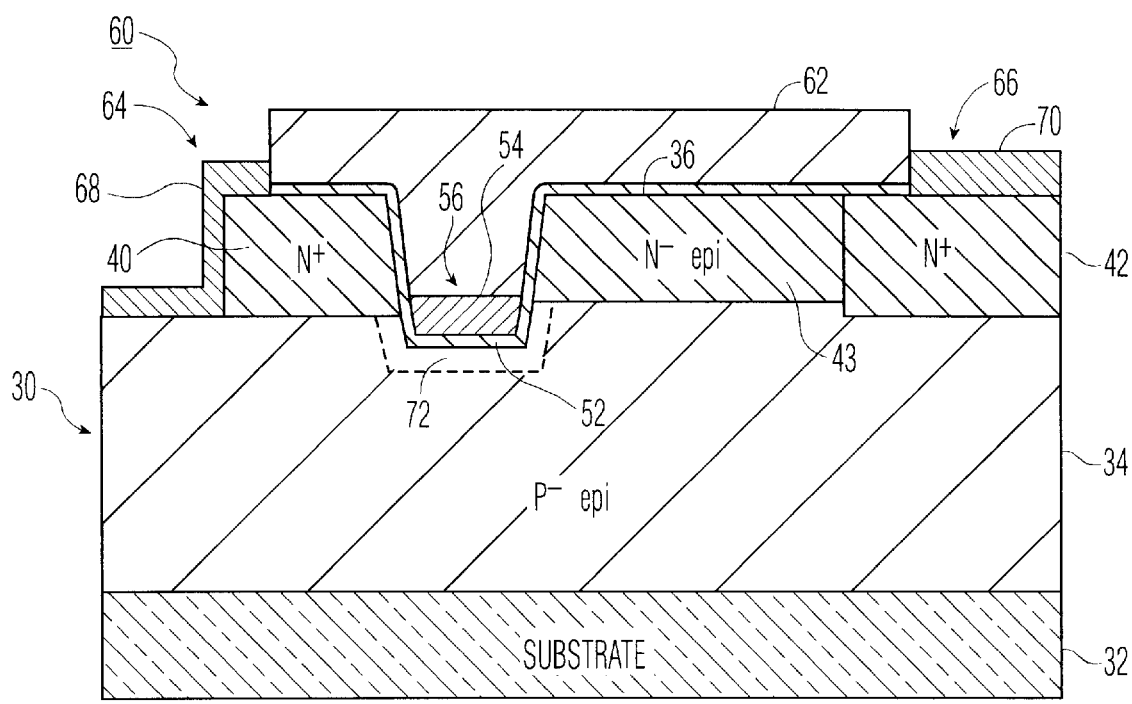
FIG. 7 is a cross-sectional view of the completed SiC LMOSFET of the invention.

FIG. 7 shows the completed SiC LMOSFET 60 of the invention. The LMOSFET 60 is finalized by applying a second layer 62 of oxide material such as silicon dioxide over the top of the layered wafer 30 shown in FIG. 6. The second layer 62 of oxide material fills the remainder of the trench 44 and electrically isolates the top of the wafer 30. Windows 64, 66 are defined in the oxide layers 62, 52 to provide access to the source region 40, the self-aligned gate structure 56 (window is located laterally and not visible in this view) and the drain region 42. Finally, electrically conductive contacts 68, 70 to the source region 40, gate 56 (contact not visible) and drain region 42, are deposited in the windows 64, 66 using conventional techniques. The contacts 68, 70 (including the contact not visible in the drawings) and their corresponding source region 40, drain region 42, and gate structure 56, define source, drain, and gate electrodes of the LMOSFET 60.

In addition to providing a self-aligned gate structure 56 with minimal gate-to-source and gate-to-drift region overlap, the present LMOSFET 60 structure advantageously provides a channel region 72 in the P– epilayer 34. The channel region 72 changes from p-type to n-type due to inversion when a positive voltage greater than the threshold voltage of the LMOSFET 60 is applied to the gate 56 thereby providing a low resistance current path between the source region 40 and drift region 43.

Additional advantages realized with the LMOSFET 60 include substantial alleviation of gate reach through as the depletion does not spread laterally towards the source. The depletion in this structure is restricted to drift region 43 and the P– epilayer 34 underneath the drift region 43. Further advantages come from the drift region 43 being formed by the N– epilayer 36 which has superior mobility values in comparison to implanted N– layers. Consequently, the epitaxial formed drift region 43 increases the electrical breakdown voltage of the LMOSFET 60 without undesirably increasing the "on-resistance" thereof. The use of the epitaxial formed drift region 43 also provides the designer with greater freedom in specifying the doping concentration and thickness of this region 43, than drift regions formed using implantation. The LMOSFET 60 also has a smaller pitch size.

Still further, the self-aligned SiC LMOSFET 60 of the invention should provide better linearity, efficiency and power density at comparable frequencies, and higher frequency operation than Si LDMOSFETs. Accordingly, the SiC LMOSFET 60 of the invention can replace Si LDMOSFETs in UHF transmitters at 2 GHz and extend the transmission range up to at least 4 GHz.

While the foregoing invention has been described with reference to the above embodiment, various modifications and changes can be made without departing from the spirit of the invention. Accordingly, all such modifications and changes are considered to be within the scope of the appended claims.

What is claimed is:

1. A lateral metal-oxide-semiconductor field effect transistor (LMOSFET) having a self-aligned gate, the LMOSFET comprising:

a first layer of silicon carbide semiconductor material having a p-type conductivity;

a second layer of silicon carbide semiconductor material having an n-type conductivity formed on the first layer;

source and drain regions having n-type conductivities formed in the second silicon carbide semiconductor layer, the n-type conductivities of the source and drain regions being greater than the n-type conductivity of the second silicon carbide layer;

a trench extending through the second silicon carbide semiconductor layer and partially into the first silicon carbide semiconductor layer so that the source and drain regions are substantially lateral thereto, the trench coated with a layer of an electrically insulating oxide material and partially filled with a layer of metallic material, the layers of oxide and metallic material forming a gate structure;

a channel region defined in the first layer beneath the gate structure; and electrical contacts associated with the source and drain regions, and the gate structure thereby establishing source, drain, and gate electrodes of the LMOSFET.

2. The LMOSFET according to claim 1, further comprising a substrate which supports the first and second silicon carbide semiconductor layers.

3. The LMOSFET according to claim 1, wherein the first layer of silicon carbide semiconductor material is an epitaxial layer.

4. The LMOSFET according to claim 1, wherein the second layer of silicon carbide semiconductor material is an epitaxial layer.

5. The LMOSFET according to claim 4, wherein the epitaxial second layer of silicon carbide semiconductor material defines a drift region that extends laterally from the drain region to the gate structure, the gate structure being substantially aligned with the source and drift regions.

6. The LMOSFET according to claim 1, wherein the source and drain regions each have a depth which is at least equal to the thickness of the second layer of silicon carbide material.

7. The LMOSFET according to claim 6, wherein the source and drain regions extend partially into the first layer of silicon carbide semiconductor material and each have a depth which is slightly less than the depth of the trench.

8. The LMOSFET according to claim 1, wherein the source and drain regions are implanted regions.

* * * * *